United States Patent
Stahl et al.

(10) Patent No.: US 9,506,969 B2
(45) Date of Patent: Nov. 29, 2016

(54) NOISE SENSOR

(71) Applicant: NXP B.V., Eindhoven (NL)

(72) Inventors: Juergen Stahl, Herrieden (DE); Jens Goettle, Erlangen (DE); Thomas Duerbaum, Baiersdorf (DE); Alexander Pawellek, Stadtlauringen (DE); Anton Blom, Wijchen (NL); Hans Halberstadt, Nijmegen (NL); Frans Pansier, Nuenen (NL)

(73) Assignee: NXP B.V., Eindhoven (NL)

( * ) Notice: Subject to any disclaimer, the term of this patent is extended or adjusted under 35 U.S.C. 154(b) by 60 days.

(21) Appl. No.: 14/591,685

(22) Filed: Jan. 7, 2015

(65) Prior Publication Data

US 2015/0212133 A1 Jul. 30, 2015

(30) Foreign Application Priority Data

Jan. 28, 2014 (EP) .................... 14152935

(51) Int. Cl.
*G01R 27/08* (2006.01)
*H02J 1/02* (2006.01)
(Continued)

(52) U.S. Cl.
CPC .................. *G01R 29/26* (2013.01); *G01R 1/30* (2013.01); *H03F 3/45475* (2013.01); *H03F 2200/261* (2013.01); *H03F 2200/372* (2013.01); *H03F 2203/45418* (2013.01); *H03F 2203/45528* (2013.01); *H03F 2203/45544* (2013.01); *H03F 2203/45594* (2013.01); *H03F 2203/45701* (2013.01)

(58) Field of Classification Search
CPC ..... G01R 29/26; G01R 1/30; H03F 3/45475; H03F 2200/261; H03F 2203/45528; H03F 2203/45701; H03F 2203/45544; H03F 2203/45418; H03F 2200/372
USPC ................................... 324/613, 691; 363/39
See application file for complete search history.

(56) References Cited

U.S. PATENT DOCUMENTS 4,904,953 A 2/1990 McCormack
2004/0008527 A1* 1/2004 Honda ................ H02M 1/12
363/39

(Continued)

FOREIGN PATENT DOCUMENTS

EP 2 538 231 A1 12/2012
WO 2012/175226 A1 12/2012

OTHER PUBLICATIONS

Extended European Search Report for EP Patent Appln. No. 14152935.4 (Apr. 9, 2014).

(Continued)

*Primary Examiner* — Farhana Hoque

(57) ABSTRACT

A common mode noise sensor with a single amplification path is disclosed. The common mode noise sensor includes first and second terminals for receiving respective first and second signals from a power supply, an amplifier stage connected to the first and second terminals and having an output and a resistor network connected to the amplifier stage. The resistor network is arranged such that the output of the amplifier stage is configured to provide an output signal in which a differential mode noise in the first and second signals is suppressed in preference to a common mode noise in the first and second signals.

14 Claims, 3 Drawing Sheets

(51) Int. Cl.
   *G01R 29/26* (2006.01)
   *H03F 3/45* (2006.01)
   *G01R 1/30* (2006.01)

(56) References Cited

U.S. PATENT DOCUMENTS

2005/0053227 A1  3/2005  Fortier
2009/0067614 A1  3/2009  Washburn et al.

OTHER PUBLICATIONS

Chen, W. et al. "An Experimental Study of Common- and Differential-Mode Active EMI Filter Compensation Characteristics", IEEE Transactions on Electromagnetic Compatibility, vol. 51, No. 3, pp. 683-691 (Aug. 2009).

* cited by examiner

NOISE SENSOR

CROSS-REFERENCE TO RELATED APPLICATIONS

This application claims the priority under 35 U.S.C. §119 European patent application no. 14152935.4, filed on Jan. 28, 2014, the contents of which are incorporated by reference herein.

The invention relates to a noise sensor. In particular, although not exclusively, the invention relates to a common mode noise sensor.

Transient noise on a power line may be expressed as a potential difference with respect to the protective earth. In a power supply with two power lines and with or without an earth connection, the transient noise can include common mode (CM) noise and differential mode (DM) noise. CM noise is a potential that is present on both lines compared to earth. DM noise can be expressed as a potential of opposing magnitude present on each of the power lines compared with the earth. In typical applications, both CM and DM noise are present.

Electromagnetic compatibility is an important issue for many electronic device applications. For example, electromagnetic compatibility may need to be ensured in order to comply with international standards. In addition, the increasing electromagnetic noise susceptibility of many digital circuits increases the importance of maintaining electromagnetic compatibility.

It is known that passive filters can be used to reduce electromagnetic interference (EMI) noise. Passive filters can be cheap and robust, but may occupy a lot of physical space on a printed circuit board (PCB) when compared to the space occupied by components that provide functionality. In addition, the energy consumption of passive filters cannot be neglected and such filters can therefore reduce the efficiency of the whole system.

Active filters may be considered as providing advantages over passive filters in terms of PCB space occupation and power efficiency. In order to actively reduce EMI noise, the noise signal to be compensated for must be detected. However, the sensing of a total noise signal may be insufficient for an active filter because the two types of conducted noise (common mode (CM) and differential mode (DM) noise) require different cancellation or mitigation methods. Therefore, it can be important to sense, or determine, the CM and/or DM noise separately so that the noise can be properly accounted for.

In some noise sensors, a phase shift within the noise sensor can lead to a reduced accuracy for sensing of the common mode noise signal.

According to a first aspect of the invention there is provided a common mode noise sensor with a single amplification path comprising:

first and second terminals for receiving respective first and second signals from a power supply;
an amplifier stage connected to the first and second terminals and having an output; and
a resistor network connected to the amplifier stage, the resistor network arranged such that the output of the amplifier stage is configured to provide an output signal in which a differential mode noise in the first and second signals is suppressed in preference to a common mode noise in the first and second signals.

The provision of a single amplification path for providing a signal representative of the common mode noise means that difficulties involving phase shift due to parallel amplification paths are alleviated. In addition, by providing first and second terminals for receiving the respective first and second signals from the power supply, the common mode noise sensor may be directly, rather than inductively, coupled to the power supply. The avoidance of inductive couplings enables the cost and size of the common mode noise sensor to be reduced. The arrangement of the resistance network, rather than the arrangement of a coupling to the power supply, for example, enables the common mode noise sensor to provide an output signal in which differential mode noise is suppressed in preference to common mode noise.

The differential mode noise may be cancelled by the amplifier stage due to the arrangement of the resistor network such that the output signal is representative of the common mode noise. The ratio of common mode noise to differential mode noise in the output signal may be greater than 10.

The first and/or second terminals may be configured to be directly connected and/or capacitive coupled to the power supply. The amplifier stage may have an inverting input and a non-inverting input. The inverting input may be connected to the first terminal via a filter capacitor.

Resistances of the respective resistors in the resistor network may be weighted such that the amplifier stage is configured to provide the output signal such that the differential mode noise in the first and second signals is suppressed in preference to the common mode noise in the first and second signals.

The resistor network may comprise one or more of a first resistor, a second resistor, a third resistor and a fourth resistor. The first resistor may be connected in series with the filter capacitor between the first terminal and the inverting input of the amplifier stage. The second resistor may be connected between the output of the amplifier stage and the inverting input of the amplifier stage. The third resistor may be connected between the non-inverting input of the amplifier stage and earth. The fourth resistor may be connected between the non-inverting input and the second terminal. A resistance, $R_1$, of the first resistor may be $$R_1 = \frac{2R_2R_3 + R_2R_4}{R_4},$$

where $R_2$ is the resistance of the second resistor, $R_3$ is the resistance of the third resistor and $R_4$ is the resistance of the fourth resistor.

An earth capacitor may be provided in series with the third resistor between the non-inverting input and earth. The earth may be protective earth. The earth capacitor may be a y-capacitor.

The resistor network may comprise a fifth resistor. The first resistor may be connected to the filter capacitor at a node. The fifth resistor may be connected between the node and the second terminal. The fifth resistor may be provided between the inverting and non-inverting inputs of the amplifier stage.

The power supply may be an alternating current supply and the first and second terminals are each configured to be coupled to one of a phase terminal and a neutral terminal of the power supply. Alternatively, the power supply may be a direct current supply and the first and second terminals are each configured to be coupled to one of a positive terminal and a negative terminal of the power supply. Alternatively the power supply may include a rectifier and the first and second terminals may each be configured to be coupled to one of a positive and a negative supply line of the rectifier. The power supply may also have an earth, or protective earth, terminal. A voltage supply of the amplifier stage is referenced to the neutral line, the negative terminal, a circuit ground, or any other point. The output of the amplifier may be referenced to the same point.

The common mode noise sensor may not include an inductor. In particular, the noise sensor may not include an inductor that is configured to couple the noise sensor to the power supply. Thus, the noise sensor may be configured to sense the common mode noise using only the amplifier stage and resistive and capacitive passive elements. The single amplification path may comprise a single amplifier stage. That is, the amplifier stage may be a single amplifier stage, such as a single operational amplifier.

According to a second aspect of the invention there is provided a noise cancelling device comprising a common mode noise sensor as disclosed herein.

One or more embodiments of the invention will now be described, by way of example only, and with reference to the accompanying figures in which:

FIG. 1 shows a circuit diagram for a CM-DM noise sensor with first, second and third terminals 106, 107, 108 respectively coupled to a phase line P, a neutral line N and a protective earth PE of a power supply with an alternating current or direct current input.

Figure 1:
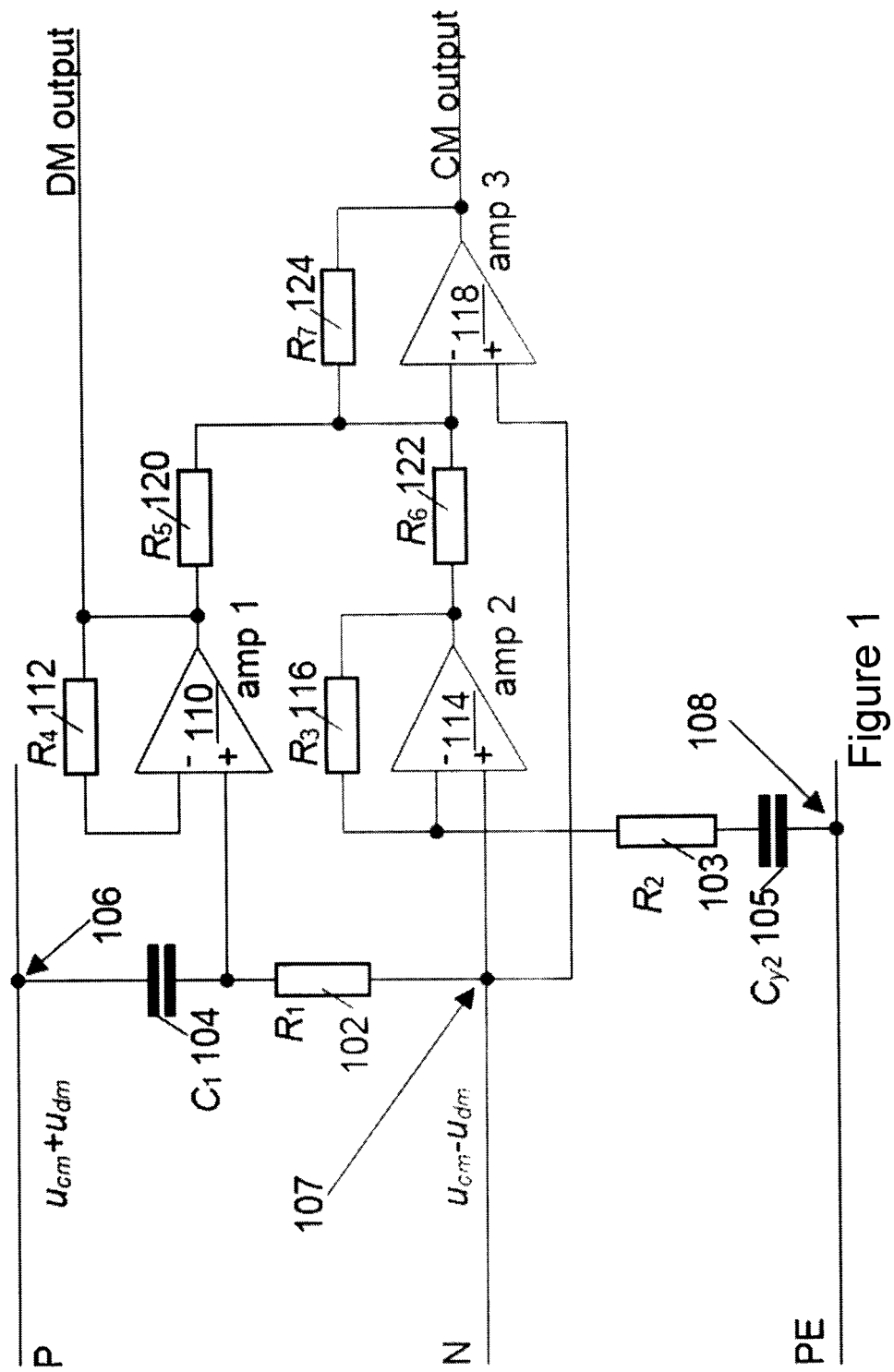
FIG. 1 shows a circuit diagram for a CM-DM noise separator.

A first capacitor 104 and a first resistor 102 are provided in series between the first and second terminals 106, 107 of the noise sensor. A first plate of the first capacitor 104 is coupled to the first terminal 106. A second plate of the first capacitor 104 is coupled to a first terminal of the first resistor 102. A second terminal of the first resistor 102 is coupled to the second terminal 107 of the noise sensor.

With respect to protective earth PE, the phase line P has a potential of CM+DM and the neutral line N has a potential of CM−DM (neglecting the low frequency input voltage). The potential difference across the first resistor 102 is the difference of these two potentials (2 DM) in a certain frequency range. The first capacitor 104 (or filter capacitor) acts as a high pass filter that blocks low frequency signals (such as DC or 50 Hz) but enables high frequency noise to pass from the first terminal 106 to the noise sensor.

The noise sensor has three operational amplifiers 110, 114, 118. The arrangement shown in FIG. 1 makes use of voltage sensing, although the skilled person will appreciate that a current sensing arrangement may also be provided. The noise sensor is referenced to the mains neutral N line, rather than to the protective earth line. Alternatively, the amplifiers could be referenced to the mains phase power line P, a DC line or to a circuit ground. That is, the power supply or supplies for amplifiers 110, 114, 118 can be generated with reference to the neutral line (or alternatively the phase line, a DC line or a circuit ground) of the mains supply, or switch mode power supply.

The first amplifier 110 has a non-inverting input coupled to the second plate of the first capacitor 104 and the first terminal of the first resistor 102. The signal feeding the non-inverting input of the first amplifier 110 represents the difference between the potentials at the phase and neutral lines in a certain frequency range. In this example, a first feedback resistor R4 112 is connected between the output of the first amplifier 110 and an inverting input of the first amplifier 110 in order to provide a feedback path. The output of the first amplifier 110 is proportional to the DM noise on the power supply lines measured with respect to the neutral line N (reference line).

A second amplifier 114 has a non-inverting input coupled to the second terminal 107 of the noise sensor. A first terminal of the second resistor 103 is coupled to the inverting input of the second amplifier 114. A second terminal of the second resistor 103 is coupled to a first plate of the second capacitor 105. A second plate of the second capacitor 105 is coupled to the third terminal 108 of the noise sensor. A second feedback resistor R3 116 is connected between the output of the second amplifier 114 and the inverting input of the second amplifier 114 in order to provide a feedback path. The signal at the output of the second amplifier 114 is proportional to CM noise minus DM noise (CM−DM).

A third amplifier 118 is configured to receive signals from the outputs of the first and second amplifiers 110, 114 at its inverting input. The output of the first amplifier 110 is coupled to the inverting input of the third amplifier 118 via a first channel resistor R5 120. The output of the second amplifier 114 is coupled to the inverting input of the third amplifier 118 via a second channel resistor R6 122. The third amplifier 118 effectively sums the signals from the first and second amplifiers 110, 114. The non-inverting input of the third amplifier is coupled to the second terminal 107 of the noise sensor. A third feedback resistor R7 124 is connected between the output of the third amplifier 118 and the inverting input of the third amplifier 118 in order to provide a feedback path.

From theory, the output of the third amplifier 118 would be expected to be proportional to the common mode noise. However, it has been found that, for at least some practical implementations of the noise sensor shown in FIG. 1, it can be difficult to obtain reliable readings of the common mode noise. The signal propagation path length of the first amplifier 110 and the second amplifier 114 differ due to their different amplification values. A relative phase shift is therefore present in the signals added together by the third amplifier 118. The difference in signal propagation time means that the addition of DM from the first amplifier 110 and CM'−DM' (the prime denoting a phase shift) from the second amplifier 114 results in the third amplifier providing an output proportional to CM'−DM'+DM, rather than the desired CM signal.

Figure 2:
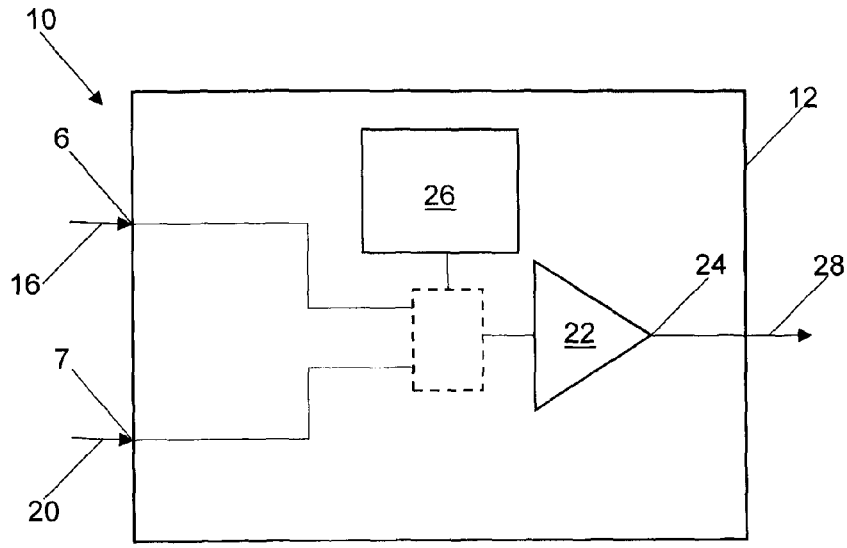
FIG. 2 shows a schematic representation of a CM noise separator.

FIG. 2 illustrates a common mode noise sensor 10 with a single amplification path 12 for determining common mode noise in power supply signals. The single amplification path 12 comprises a first terminal 6 for receiving a first signal 16 from the power supply and a second terminal 7 for receiving a second signal 20 from the power supply. The provision of the single amplification path 12 means that difficulties due to the phase shift between parallel amplification paths, such as by the first and second amplifiers in FIG. 1, are eliminated.

The power supply can be a power supply with an alternating current input, as described in relation to FIG. 1. The first and second terminals 6, 7 are each configured to be coupled to one of a phase terminal and a neutral terminal of the power supply in the alternating current case. Alternatively, the power supply may be a power supply with a direct current input. In the direct current case, first and second terminals 6, 7 are each configured to be coupled to one of a positive terminal and a negative terminal of the power supply.

An amplifier stage 22 is connected to the first and second terminals 6, 7 and has an output 24. A resistor network 26 is connected to the amplifier stage 22. The resistor network 26 is arranged such that the amplifier stage 22 is configured to provide, at its output 24, an output signal 28 in which a differential mode (DM) noise in the first and second signals 16, 20 is suppressed by the amplifier stage 22 in preference to a common mode (CM) noise in the first and second signals 16, 20. Preferably, the DM noise is cancelled by the amplifier stage 22 due to the arrangement of the resistor network 26 such that the output signal 28 is representative of only the CM noise.

Figure 3:
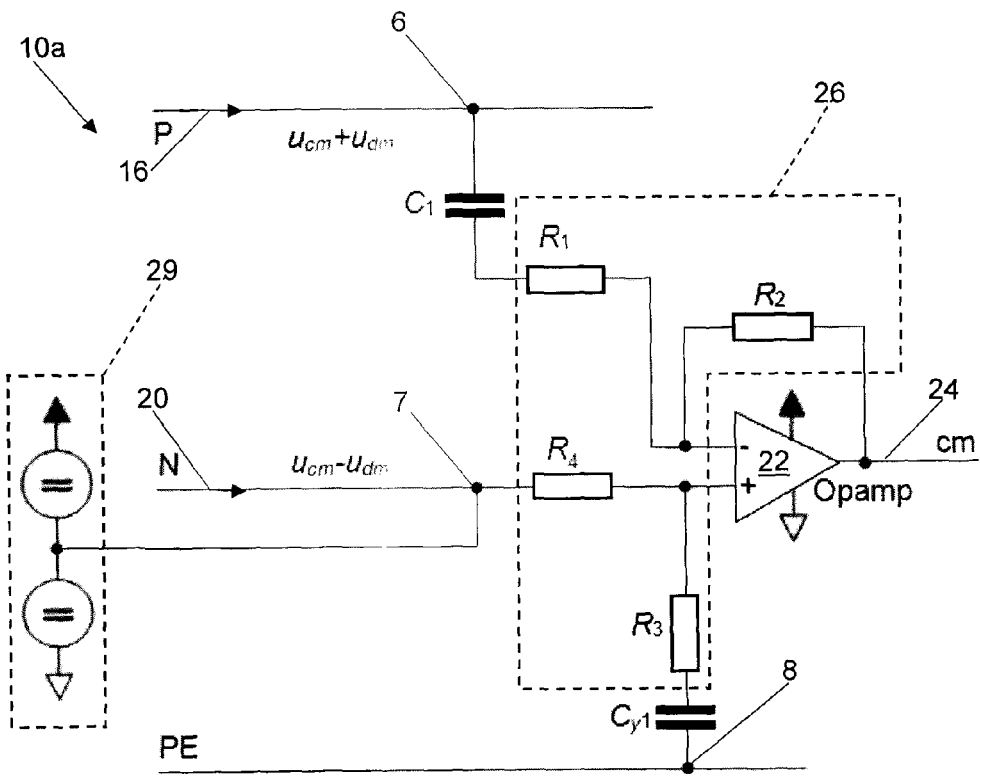
FIG. 3 shows a circuit diagram of a CM noise separator for a power supply.

FIG. 3 illustrates a circuit diagram for a CM noise sensor 10a such as that described with reference to FIG. 2. The CM noise sensor 10a is connected to a power supply. The power supply can be a power supply with alternating current input or direct current input. The first terminal 6 is configured to be directly connected to the phase power supply P 16. The second terminal 7 is configured to be directly connected to the neutral power supply N 20. The neutral N and the phase P can be interchanged, while the proposed circuit still performs the same function. P and N may also be the positive and negative terminal for a power supply with direct current input. The CM noise sensor 10a also has a third terminal 8 coupled to a protective earth PE of the power supply.

The amplifier stage 22 is provided by an operational amplifier that is configured to receive a voltage supply 29 referenced to neutral N (or alternatively a negative line of a DC supply or a circuit ground). The operational amplifier has an inverting input and a non-inverting input. The inverting input is connected to the first terminal 6 via a filter capacitor $C_1$. The filter capacitor $C_1$ enables the amplifier stage 22 to be capacitively coupled to the phase power supply 16. The value of the filter capacitor $C_1$ can be chosen such that the supply voltage is blocked, but that high frequency noise is allowed to pass. The filter capacitor $C_1$ can be an ordinary capacitor, or x-capacitor, depending on the application/positioning of the sensor. Capacitive elements can be cheaper, smaller and do not impose the same bandwidth constraints as inductive sensors, or couplings. The capacitor $C_1$ is optional depending on the application of the sensor.

The resistor network 26 comprises a first resistor $R_1$, a second resistor $R_2$, a third resistor $R_3$ and a fourth resistor $R_4$. The first resistor $R_1$ is connected in series with the filter capacitor $C_1$ between the first terminal 6 of the noise sensor 10 and the inverting input of the amplifier 22. The second resistor $R_2$ is connected between the output of the amplifier stage 22 and the inverting input of the amplifier 22. The third resistor $R_3$ is connected between the non-inverting input of the amplifier and the third terminal 8 connected to the protective earth PE of the power supply. An optional capacitor $C_{y1}$ is provided in series with the third resistor $R_3$ between the non-inverting input and earth. The capacitor is typically provided as a y-capacitor for safety reasons. The fourth resistor $R_4$ is connected between the non-inverting input of the amplifier 22 and the second terminal 7 of the noise sensor.

Suitable values for the components of the resistor network 26 may be chosen such that DM noise is cancelled and the output signal is representative of only the CM noise. In order to determine suitable values an equation describing the operation of the amplifier stage 22 is rearranged as discussed below. In this embodiment, the reference of the output 24 is the same as the reference of the voltage supply 29.

It is assumed that the impedance of the capacitors $C_1$ and $C_{y1}$ is negligible in comparison to $R_1$ and $R_3$ in the frequency range of the noise signals. Capacitors $C_1$ and $C_{y1}$ are therefore considered to be replaced by a short circuit in the following analysis.

The voltage $U_{OUT,N}$ at the CM output 24 referenced to neutral N is calculated, for the arrangement of the resistor network 26 shown in FIG. 3, as:

$$u_{out,N} = -\frac{R_2}{R_1}\left[(u_{cm} + u_{dm}) - \frac{R_3}{R_3 + R_4}(u_{cm} - u_{dm})\right] - \frac{R_4}{R_3 + R_4}(u_{cm} - u_{dm}),$$

which can be rearranged to:

$$u_{out,N} = u_{cm}\left[-\frac{R_2}{R_1} + \frac{R_2 R_3}{R_1(R_3 + R_4)} - \frac{R_4}{R_3 + R_4}\right] + u_{dm}\left[-\frac{R_2}{R_1} - \frac{R_2 R_3}{R_1(R_3 + R_4)} + \frac{R_4}{R_3 + R_4}\right].$$

For a full suppression (cancellation) of the DM part in ideal case, the second bracket of the above equation for $U_{OUT,N}$ has to equal zero. That directly leads to:

$$-R_2(R_3+R_4)-R_2R_3+R_4R_1=0.$$

Hence, the resistor $R_1$ is given by:

$$R_1 = \frac{2R_2R_3 + R_2R_4}{R_4}.$$

Otherwise, DM noise causes a signal at the CM noise output, even under ideal conditions.

It will be appreciated that such a CM noise sensor enables determination of the unwanted DM noise component as well as for use in mitigation of the detected CM noise. A noise cancelling device may be provided, as is known in the art, where the noise cancelling device is configured to counteract the noise signal based on the output signal from the amplifier stage 22. The proposed noise sensor can be part of an EMI filter.

An additional amplifier stage can be provided in series with the amplifier stage 22 in order to increase the gain of the noise sensor. Such a modified noise sensor can still be considered to have only a single amplification path.

Figure 4:
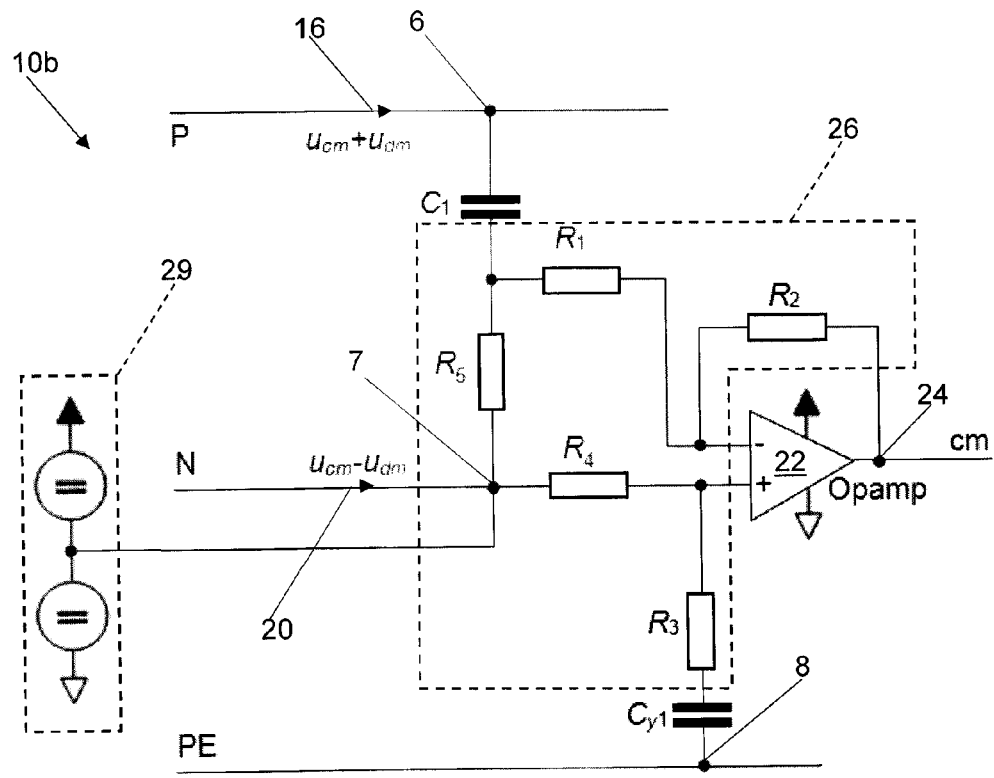
FIG. 4 shows a circuit diagram of another CM noise separator for a power supply.

FIG. 4 illustrates a circuit diagram of another embodiment of a CM noise sensor 10b similar to that illustrated in FIG. 3. The resistor network 26 comprises a fifth resistor $R_5$. The first resistor $R_1$ can be considered to be connected to the filter capacitor $C_1$ at a node. The fifth resistor $R_5$ is connected between the node and the second terminal 7 of the noise sensor 10b. It has been found that provision of the fifth resistor $R_5$, or equivalent arrangements, can be used to account for internal non-ideal effects of the amplifier stage 22 and so provide a more accurate estimate of the CM noise at the output 24. Suitable values for the fifth resistor $R_5$ are application specific and can be found by rudimentary experimentation.

Figure 5:
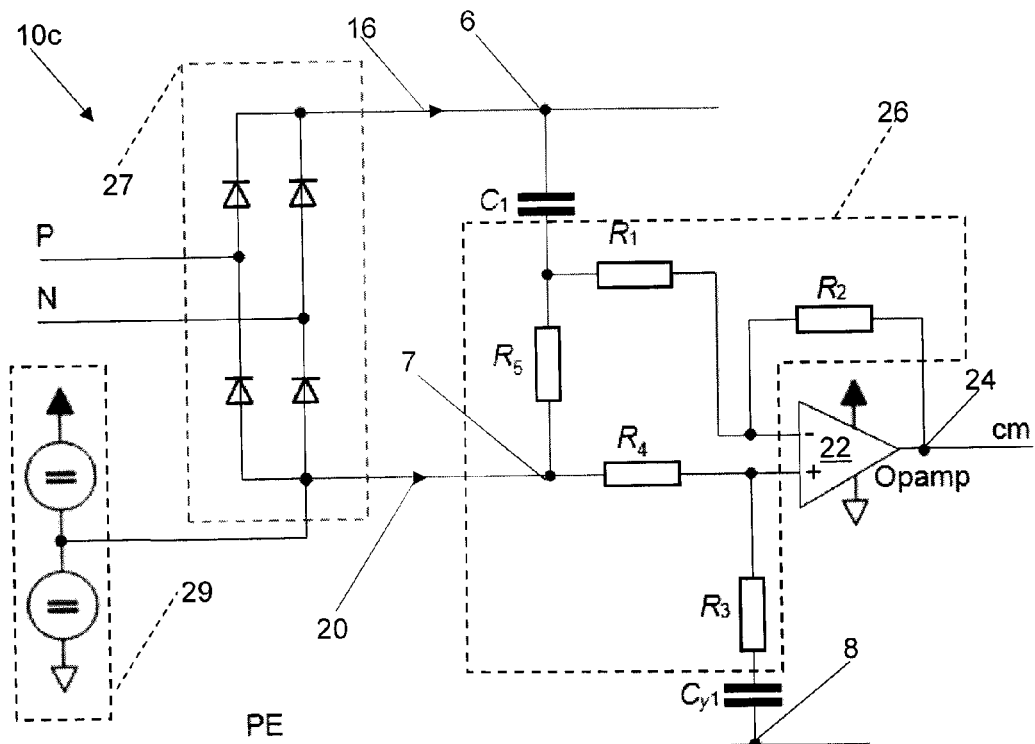
FIG. 5 shows a circuit diagram of another CM noise separator for a power supply that has an input diode bridge rectifier.

FIG. 5 shows a circuit diagram of another embodiment of a CM noise sensor 10c similar to that illustrated in FIG. 3. The noise sensor 10c is coupled to a power supply with DC input that is provided, in this example, from a power supply with an AC input using a rectifier 27 as is known in the art. The first terminal 6 is coupled to a positive power supply line 16. The second terminal 7 is coupled to a negative power supply line 20. The voltage supply of the amplifier stage is taken with reference to the negative power supply line 20. The polarity of the rectifier 27 (or first and second terminals 6, 7) could be reversed without affecting the functionality of the CM noise sensor 10c.

The invention claimed is:

1. A common mode noise sensor with a single amplification path comprising:
   first and second terminals for receiving respective first and second signals from a power supply;
   an amplifier stage connected to the first and second terminals and having an output; and
   a resistor network connected to the amplifier stage, the resistor network arranged such that the output of the amplifier stage is configured to provide an output signal in which a differential mode noise in the first and second signals is suppressed in preference to a common mode noise in the first and second signals; and
   wherein the resistor network comprises a first resistor, a second resistor, a third resistor and a fourth resistor,
   the first resistor connected in series with a filter capacitor between the first terminal and an inverting input,
   the second resistor connected between the output and the inverting input,
   the third resistor is connected between a non-inverting input and earth, and
   the fourth resistor in connected between the non-inverting input and the second terminal.

2. The common mode noise sensor of claim 1, wherein the differential mode noise is cancelled by the amplifier stage due to the arrangement of the resistor network such that the output signal is representative of the common mode noise.

3. The common mode noise sensor of claim 1, wherein the first and second terminals are configured to be directly connected or capacitive coupled to the power supply.

4. The common mode noise sensor of claim 1, wherein a ratio of common mode noise to differential mode noise in the output signal is greater than 10.

5. The common mode noise sensor of claim 1, wherein resistors in the resistor network are weighted such that the output of the amplifier stage is configured to provide the output signal such that the differential mode noise in the first and second signals is suppressed in preference to the common mode noise in the first and second signals.

6. The common mode noise sensor of claim 1, wherein the amplifier stage has the inverting input and the non-inverting input, wherein the inverting input is connected to the first terminal via the filter capacitor.

7. The common mode noise sensor of claim 1, wherein the resistance, $R_1$, of the first resistor:

$$R_1 = \frac{2R_2R_3 + R_2R_4}{R_4},$$

where $R_2$ is the resistance of the second resistor, $R_3$ is the resistance of the third resistor and $R_4$ is the resistance of the fourth resistor.

8. The common mode noise sensor of claim 1, wherein a capacitor is provided in series with the third resistor between the non-inverting input and earth.

9. The common mode noise sensor of claim 8, wherein the capacitor is a y-capacitor.

10. The common mode noise sensor claim 1, wherein the resistor network comprises a fifth resistor and the first resistor is connected to the filter capacitor at a node, the fifth resistor connected between the node and the second terminal.

11. The common mode noise sensor of claim 1, wherein the power supply has an alternating current supply input and the first and second terminals are each configured to be coupled to one of a phase terminal and a neutral terminal of the power supply or to one of a positive terminal and a negative terminal from a bridge rectifier of the power supply.

12. The common mode noise sensor of claim 11, wherein a voltage supply of the amplifier stage is referenced to the neutral line the negative terminal or a circuit ground.

13. The common mode noise sensor of claim 1, wherein the common mode noise sensor does not include an inductor.

14. A noise cancelling device comprising the common mode noise sensor of claim 1.

* * * * *